United States Patent
Oh et al.

(10) Patent No.: US 6,730,583 B2
(45) Date of Patent: May 4, 2004

(54) METHOD FOR FABRICATING SEMICONDUCTOR DEVICE

(75) Inventors: Jae-Geun Oh, Ichon-shi (KR); Byung-Seop Hong, Ichon-shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 33 days.

(21) Appl. No.: 09/984,030

(22) Filed: Oct. 26, 2001

(65) Prior Publication Data

US 2002/0055241 A1 May 9, 2002

(30) Foreign Application Priority Data

Oct. 26, 2000 (KR) .......................... 2000-63159
Oct. 24, 2001 (KR) .......................... 2001-65604

(51) Int. Cl.$^7$ .................. H01L 21/425; H01L 21/22; H01L 21/336
(52) U.S. Cl. .................. 438/530; 438/542; 438/514; 438/289; 438/306; 438/301
(58) Field of Search ................ 438/289, 290, 438/301, 302, 305, 306, 530, 540, 542, 522, 519, 514

(56) References Cited

U.S. PATENT DOCUMENTS

| | | | | | |
|---|---|---|---|---|---|
| 5,604,359 | A | * | 2/1997 | Naruse et al. | 257/69 |
| 5,904,508 | A | * | 5/1999 | Codama et al. | 438/151 |
| 5,956,603 | A | * | 9/1999 | Talwar et al. | 438/520 |
| 6,100,171 | A | * | 8/2000 | Ishida | 438/535 |
| 6,191,463 | B1 | * | 2/2001 | Mitani et al. | 257/411 |
| 6,284,630 | B1 | * | 9/2001 | Yu | 438/511 |
| 6,326,219 | B2 | * | 12/2001 | Markle et al. | 438/14 |
| 6,358,826 | B1 | * | 3/2002 | Hause et al. | 438/583 |
| 6,372,585 | B1 | * | 4/2002 | Yu | 438/301 |

\* cited by examiner

*Primary Examiner*—Caridad Everhart
*Assistant Examiner*—Chuong A Luu
(74) *Attorney, Agent, or Firm*—Finnegan, Henderson, Farabow, Garrett, & Dunner, L.L.P.

(57) ABSTRACT

A source/drain formation method using multi-boron implantation instead of single-boron implantation is disclosed. The multi-boron implantation method includes a first step, in which boron-fluorine compounds are implanted for forming an amorphous layer in the source/drain region, and a second step, in which boron ions are implanted.

14 Claims, 7 Drawing Sheets

$^{73}$Ge / $^{11}$B ION IMPLANTATION $^{49}BF_2$/$^{11}B$ ION IMPLANTATION

METHOD FOR FABRICATING SEMICONDUCTOR DEVICE

FIELD OF THE INVENTION

The present invention relates to a method for fabricating semiconductor devices; more particularly, to an ion implantation and thermal treatment for forming a source/drain of transistor.

DESCRIPTION OF THE RELATED ART

Semiconductor memory devices comprise many metal oxide semiconductor (MOS) transistors, and the characteristics of semiconductor devices depend on the characteristics of MOS transistors. Ion implantation for forming source/drains is an important process determining the characteristics of the MOS transistors even though most processes for fabricating semiconductor devices effect characteristics of the MOS transistor.

Hereinafter, a conventional method for forming a MOS transistor will be described in detail.

Referring to FIG. 1A, a shallow trench isolation (STI) process is performed to form an isolation layer 2 in a silicon substrate 1, ion implantation processes are performed to form a p-well (not shown) and n-well 3 in silicon substrate 1. Thereafter, a gate oxide 4 and a gate electrode 5 are formed on silicon substrate 1. A mask oxide 6 and a spacer 7 are formed on an upper surface and sidewalls of gate electrode 5, respectively. Spacer 7 comprises oxide/nitride films, the symbol "/", as used herein when describing films, defines a layering of films, so that oxide/nitride films are a layer of an oxide film overlying a nitride film. On mask oxide 6, a photo-resist pattern 8 is formed to expose a p+ source/drain region.

Referring to FIG. 1B, $^{73}$Ge ions are implanted in the p+ source/drain region to form an amorphous layer (not shown) by using photo-resist pattern 8 as an ion implantation mask, and $^{11}$B ions are implanted in the p+ source/drain region. Thereafter, the photo-resist pattern 8 is removed, n+ source/drain regions (not shown) are formed, and then subsequent processes for forming MOS transistors are performed. Reference numeral "9" in FIG. 1B denotes the p+ source/drain formed by a thermal treatment following ion implantation. The amorphous layer, formed by the $^{73}$Ge ion implantation prior to the $^{11}$B ion implantation, prevents channeling. In some processes, $^{73}$Ge ion implantation for forming the amorphous layer is skipped by implanting $^{49}$BF$_2$ ions instead of $^{11}$B ions since the molecular weight of the $^{49}$BF$_2$ ion is large enough to form an amorphous layer.

As the integration of semiconductor devices increase, the contact size decreases and the contact resistance increases. Therefore, additional ions are implanted in the source/drain region under the contact holes in order to reduce contact resistance during the processes for forming bit line contact or metal-wire contact. Specially, additional $^{49}$BF$_2$ ions are implanted in the p$^{30}$ source/drain region because the solid solubility of a p-type dopant like $^{11}$B in a silicon crystal is lower by one-order of magnitude (one-order being 10$^{-1}$) than that of an n-type dopant like $^{31}$P or $^{75}$As, at the same temperature.

In case of implanting additional $^{49}$BF$_2$ ions, the contact resistance may be reduced, however the extent of the reduction is not so much due to the low solid solubility of $^{11}$B ions in the silicon crystal. Moreover, the end of range (EOR) defects, induced by interstitial diffusion as a result of the additional ion implantation, cause leakage current.

The dosage of F ions is always two times as much as that of B ions when $^{49}$BF$_2$ ions are implanted. The F ion prevents the B ion from transient enhanced diffusion (TED), so that it is possible to obtain shallow junctions. However, in case that the dosage of F ions is excessive, the F ions interfere with the activation of B ions causing an increase in the contact resistance.

FIG. 2 shows thermal treatments performed after the ion implantation for forming source/drain. A source/drain rapid thermal annealing (RTA) for activating dopants in the source/drain is performed at temperatures of about 1000° C. The thermal treatments performed after source/drain RTA are carried out at low temperatures in the range of 600° C. to 850° C. depending on the stabilities of subsequent processes, such as a bit line formation process, a capacitor formation process and a metal-wire formation process. However, the dopants in the p+ source/drain regions are inactivated during the low temperature processes, so that the contact resistance increases. As described in "Wolf, Silicon Processing for the VLSI Era, vol. 1, p. 304", the dopants in the p+ source/drain region are inactivated by the dislocations, which are formed easily at low temperature in the range of 600° C. to 850° C., because the dopants are precipitated on or near these dislocations.

FIG. 3 shows isochronal annealing behavior of boron. In FIG. 3, the ratio of free-carrier content, P$_{Hall}$, to dose, $\phi$, is plotted against anneal temperature. As shown in FIG. 3, the inactivation of the dopants actually increases at temperatures of 600° C. to 700° C.

But, these experimental results show that the temperature for reaching maximum resistance is about 800° C. FIG. 4 shows the sheet resistance as a function of thermal treatment conditions for p+ source/drain regions. In FIG. 4, 'RTA (1000° C.-10 s)' denotes RTA performed at a temperature of 1000° C. for 10 seconds, 'FA(800° C.-20 s)' denotes furnace annealing (FA) performed at a temperature of 800° C. for 20 seconds, 'RTA(850° C.-20 s)' denotes RTA performed at a temperature of 850° C. for 20 seconds, 'FA(700° C.-3 h)' denotes FA performed at a temperature of 700° C. for 3 hours, and 'FA(800° C.-10 m)' denotes the FA performed at a temperature of 800° C. for 10 minutes. The thermal treatments shown in FIG. 4 are performed successively. Referring to FIG. 4, the sheet resistance increases on the 'FA(800° C.-20 s)' condition (A), this is evidence showing that the inactivation of the dopants actually increase at the temperature of 800° C.

As for the n+ source/drain regions, the activation of the dopants may be recovered by thermal treatment performed at a temperature of about 850° C., because the solubility of n-type dopants in a silicon crystal is high. However, the activation of the dopants, already inactivated in the p+ source/drain region, doesn't increase even though the thermal treatment is performed at a temperature of about 850° C.

SUMMARY OF THE INVENTION

The present invention provides a semiconductor memory device fabrication method capable of improving the electrical characteristic of the source/drain region.

The present invention also provides a semiconductor memory device fabrication method capable of improving the electrical characteristic of the p-type source/drain region formed by the implantation of boron ion.

An embodiment of the present invention provides a method for fabricating a semiconductor memory device having a p-type source/drain region, comprising: forming a first amorphous layer in a p-type source/drain region by implanting first dopants including fluorine and boron, implanting second dopants including boron in the first amorphous layer formed in the p-type source/drain region, and forming the p-type source/drain by performing a thermal treatment for activating the first dopants and the second dopants.

Another embodiment of the present invention provides a method for fabricating a semiconductor memory device having a p-type source/drain, comprising: forming an amorphous layer in the p-type source/drain region by implanting first dopants including fluorine and boron, implanting second dopants including boron in the amorphous layer formed in the p-type source/drain region, and performing a plurality of subsequent processes accompanying a thermal treatment, and performing a first rapid thermal annealing process for activating the first dopants and the second dopants.

Another embodiment of the present invention provides a method for fabricating a semiconductor memory device having a p-type source/drain in a silicon substrate, comprising: forming an amorphous layer in a p-type source/drain region by implanting first dopants, including fluorine and boron, in the silicon substrate, implanting second dopants including boron in the amorphous layer formed in the p-type source/drain region, and performing a plurality of subsequent processes accompanying a thermal treatment, wherein a final thermal treatment performed among the thermal treatment is performed at a temperature of 900° C. to 1100° C. with a rapid thermal annealing method for activating the first dopants and the second dopants.

BRIEF DESCRIPTION OF THE DRAWINGS

The present invention will become apparent from the following description of the embodiments given in conjunction with the accompanying drawings, in which.

DETAILED DESCRIPTION OF THE EMBODIMENTS

The present invention provides a p-type source/drain formation method using multi-implantation instead of single-implantation.

For example, an embodiment of the present invention provides a source/drain formation method using multi-boron implantation instead of single-boron implantation. The multi-boron implantation method comprises a first step, in which boron-fluorine compounds are implanted forming an amorphous layer in the source/drain region, and a second step, in which boron ions are implanted. In the first step, at least one of compounds selected from a group consisting of $^{49}BF_2$ and $^{30}BF$ are implanted, and in the second step, $^{11}B$ or $^{30}BF$ is implanted. Contact resistances and EOR defects of the p+ source/drain regions can be reduced by controlling the dosage of fluorine (F).

Generally, the RTA for activating dopants in the p+ source/drain regions (source/drain RTA) is performed right after ion implantation, however in an embodiment of the present invention, the source/drain RTA is performed after a thermal treatment accompanying subsequent processes. That is, the source/drain RTA is performed after thermal treatments are performed at temperatures of 600° C. to 850° C. during subsequent processes, in order to increase the activation of the dopants.

A final thermal treatment performed at temperatures of 600° C. to 850° C. can be replaced by source/drain RTA performed at temperatures of 900° C. to 1100° C. thereby increasing the activation of dopants.

Hereinafter, a source/drain fabrication method according to an embodiment of the present invention will be described in detail referring to the accompanying drawings.

Figure 1A:
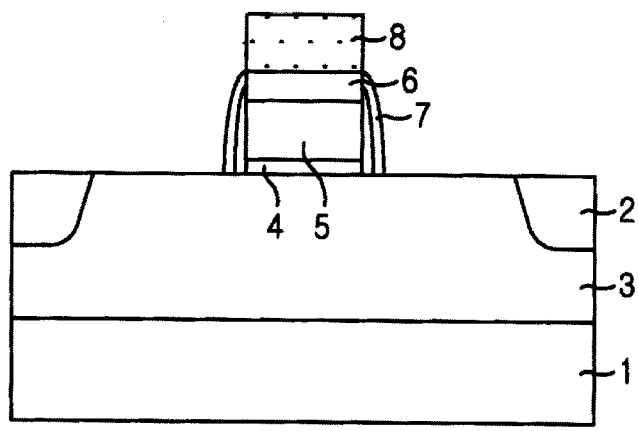
FIGS. 1A and 1B are cross sectional views showing a conventional method for forming a source/drain region of transistor.
Figure 1B:
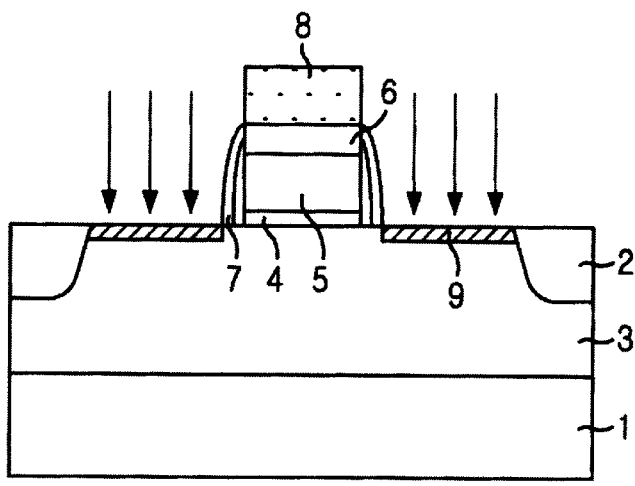
Figure 2:
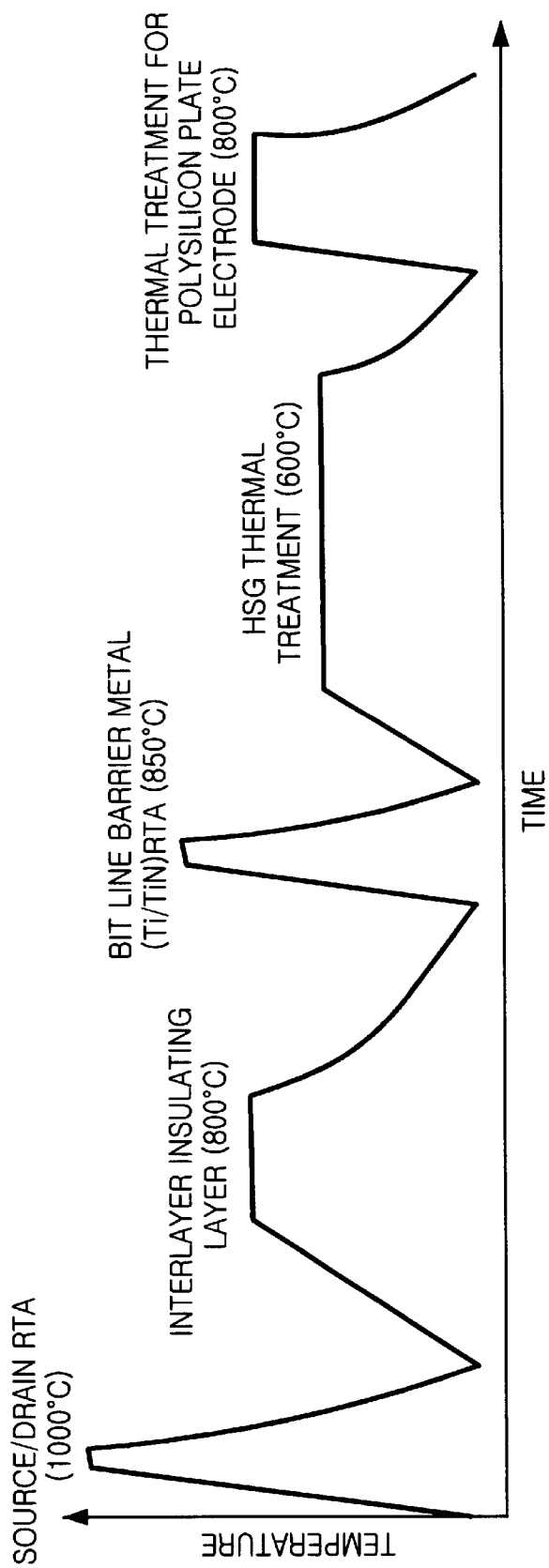
FIG. 2 shows a plurality of subsequent processes performed after forming the source/drain of transistor.
Figure 3:
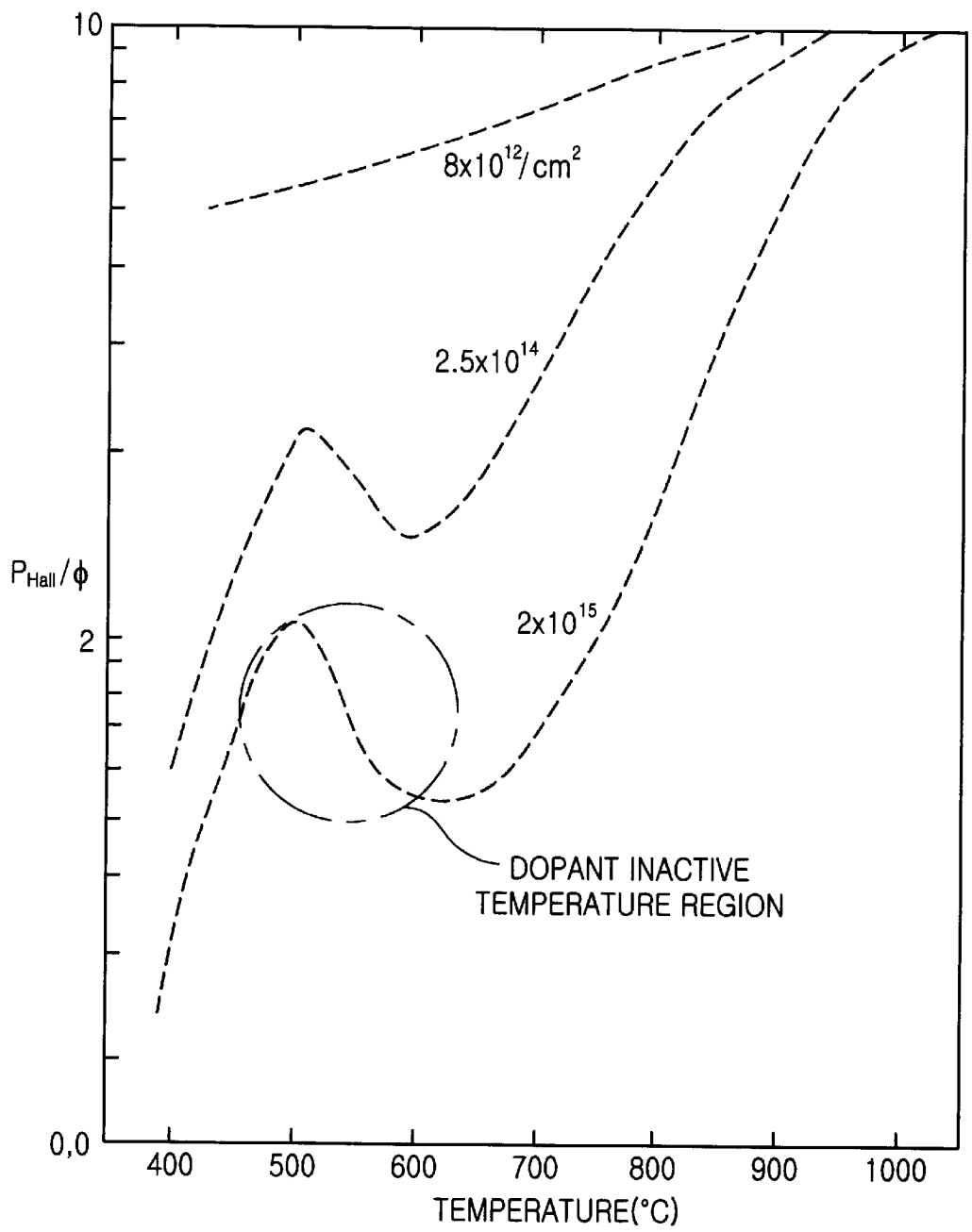
FIG. 3 shows isochronal annealing behavior of boron.
Figure 4:
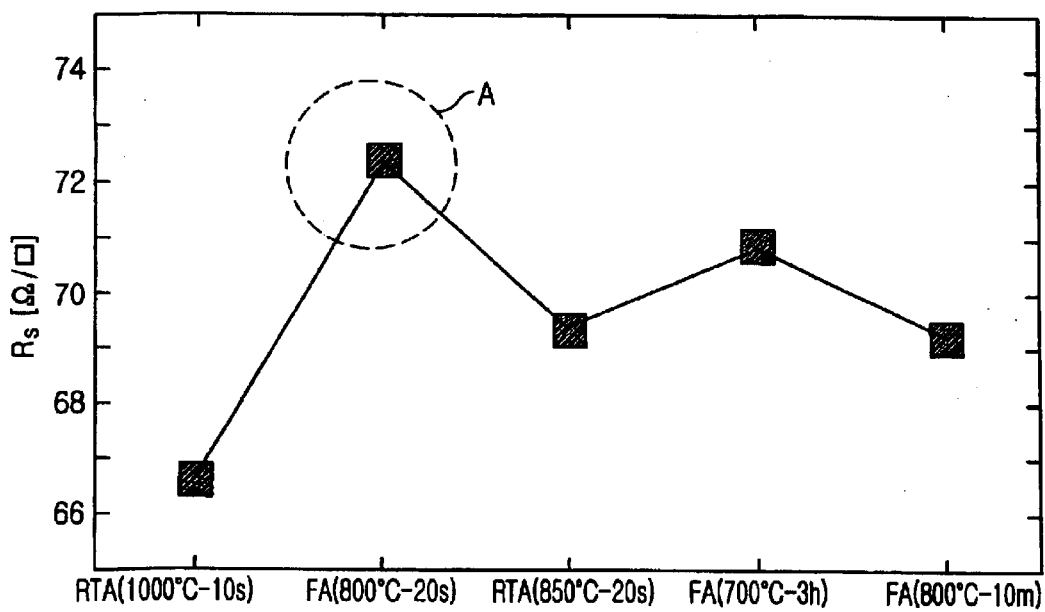
FIG. 4 shows sheet resistances as a function of thermal treatment conditions for p+ source/drain regions.
Figure 5A:
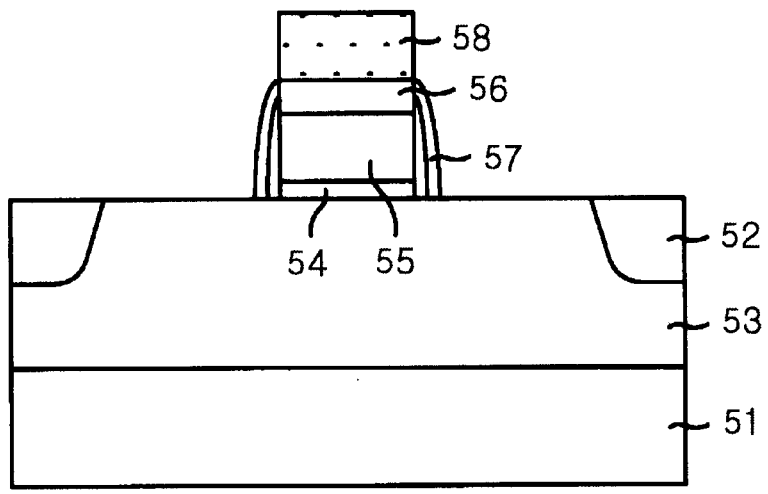
FIGS. 5A and 5B are cross sectional views showing a method for forming a source/drain of transistor according to an embodiment of the present invention.

Referring to FIG. 5A, an STI process is performed to form an isolation layer 52 in a silicon substrate 51, ion implantation processes are performed to form a p-well (not shown) and n-well 53 in silicon substrate 51. Thereafter, a gate oxide 54 and gate electrode 55 are formed on silicon substrate 51. A mask oxide 56 and a spacer 57 are formed on an upper surface and sidewalls of gate electrode 55, respectively. Spacer 57 comprises an oxide/nitride, the symbol "/" as used herein to describe films, defines a layering of films, so that oxide/nitride is a layer of an oxide film overlying a nitride film. On mask oxide 56, a photo-resist pattern 58 is formed to expose p+ source/drain regions.

Figure 5B:
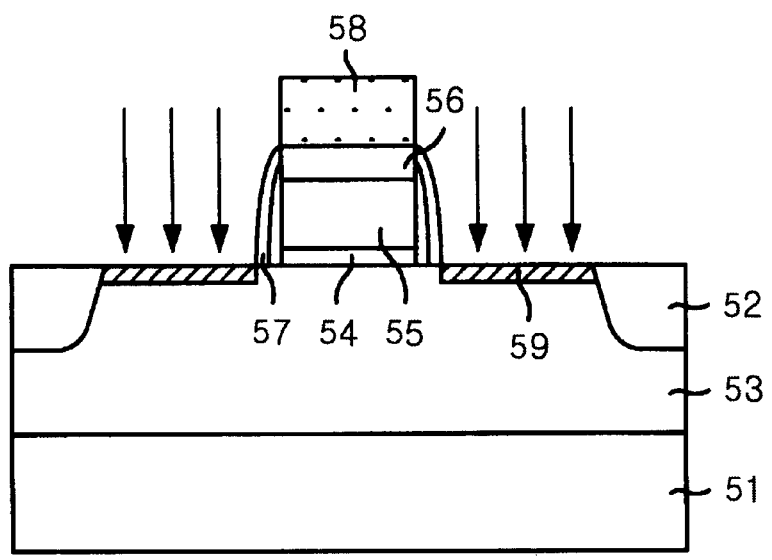

Referring to FIG. 5B, $^{49}BF_2$ ions or $^{30}BF$ ions are implanted in the p+ source/drain regions to form an amorphous layer (not shown) by using the photo-resist pattern 58 as an ion implantation mask, and $^{11}B$ ions or $^{30}BF$ ions are implanted in the p+ source/drain regions. A p+ source/drain region 59, shown in FIG. 5B, is formed by an additional thermal treatment for activating dopants, or thermal treatments accompanying subsequent processes, such as a bit line formation process, a capacitor formation process and a metal-wire formation process.

The dosage of $^{11}B$ ion is determined by the difference between a total dosage of p-type ions to be implanted in the p+ source/drain region and a dosage of the $^{49}BF_2$ ions. The dosage of the $^{49}BF_2$ can be in the range of $1\times10^{15}$#/cm$^3$~$2\times10^{15}$#/cm$^3$ and of $^{11}B$ can be in the range of $1\times10^{15}$#/cm$^3$~$2\times10^{15}$#/cm$^3$, where the symbol "#", as used herein, defines a number of dopants.

In addition, the $^{49}BF_2$ ions are implanted with an energy of 10 KeV to 30 KeV to form a shallow junction and the $^{11}B$ ions are implanted with an energy of 3 KeV to 4.5 KeV. The projected straggles (Rp) of $^{49}BF_2$ and $^{11}B$, implanted with above-mentioned energy, are the same.

Thereafter, photo-resist pattern 58 is removed, n+ source/drain regions (not shown) are formed, and then subsequent processes for fabricating semiconductor devices are performed. Additional ions are implanted in the p+ source/drain regions under the contact holes in order to reduce contact resistance, during the processes for forming bit line contact or metal-wire contact. Specifically, additional $^{49}BF_2$ or $^{30}BF$ ions are implanted to form a source/drain amorphous layer and then $^{11}$B or $^{30}$BF ions are implanted in the p$^+$ source/drain regions. The ion implantation energy is determined in consideration with the changelessness of the projected straggles. Thereafter, an additional thermal treatment for the activation of dopants or thermal treatments accompanying subsequent processes are performed.

Figure 6:
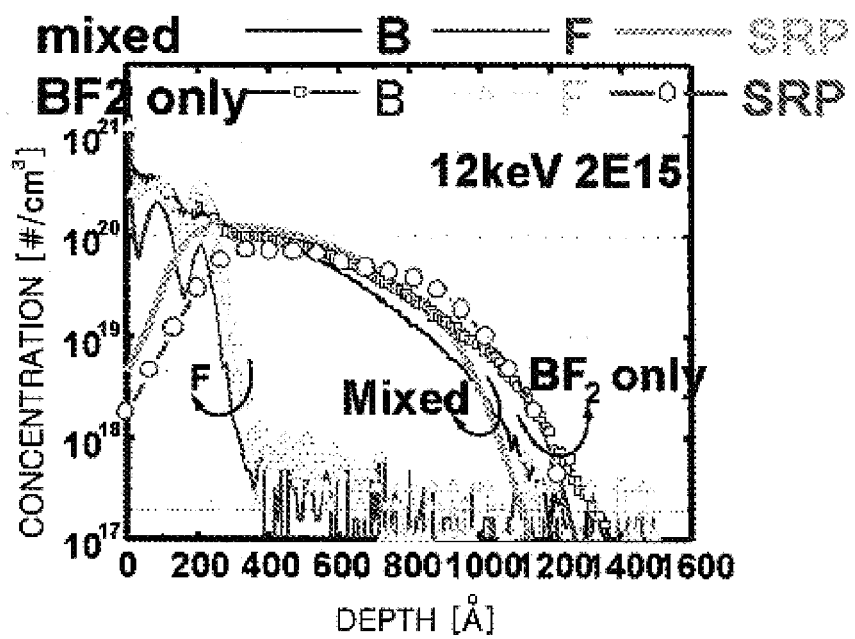
FIG. 6 shows dopant activation ratio of $^{49}BF_2$—$^{11}B$ implantation according to an embodiment of the present invention for controlling a dose of $^{19}F$, and $BF_2$ implantation.

FIG. 6 shows the dopants activation ratio of $^{49}$BF$_2$—$^{11}$B ion implantation (herein after referred to as double implantation) according to an embodiment of the present invention for controlling the dosage of $^{19}$F, and BF$_2$ implantation (herein after referred to as single implantation). Comparing a concentration of carriers contributing to dopants activation in a contact formation region, at a depth of 200 Å to 600 Å, in case of the single implantation, the concentration of carriers is 3×10$^{19}$#/cm$^3$ to 5×10$^{19}$#/cm$^3$, and in the case of double implantation, the concentration of carriers is 10$^{20}$#/cm$^3$, even though the total dosage of B is the same in both implantations.

Figure 7:
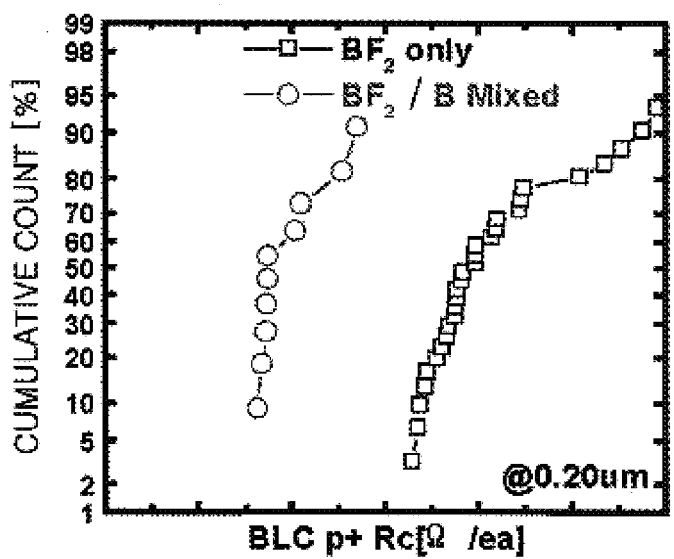
FIG. 7 illustrates contact resistance ($R_C$) characteristics obtained by the $^{49}BF_2$—$^{11}B$ implantation and single implantation, respectively.

As it is known, an ohmic contact may be formed at dopant concentrations above 10$^{19}$#/cm$^3$, and a field emission tunneling contact may be formed at the dopant concentrations above 10$^{20}$#/cm$^3$. Accordingly, a contact resistance (R$_c$) variation of the double implantation is lower than that of single implantation, as shown in FIG. 7 illustrating contact resistance (R$_c$) characteristics obtained by the double implantation and single implantation, respectively. The contact resistances (R$_c$) shown in FIG. 7 are the result of measuring a contact region 0.2 μm in size. Moreover, EOR defects may be reduced by double implantation.

As mentioned above, after ion implantation for forming p$^+$ source/drain regions, subsequent processes, such as formation of borophosphosilicate glass (BPSG), bit line barrier layer (Ti/TIN), hemi spherical grain (HSG) of storage electrode and polysilicon plate electrode, are performed and thermal treatments, accompanying these subsequent processes are performed at temperatures of 600° C. to 850° C.

Figure 8:
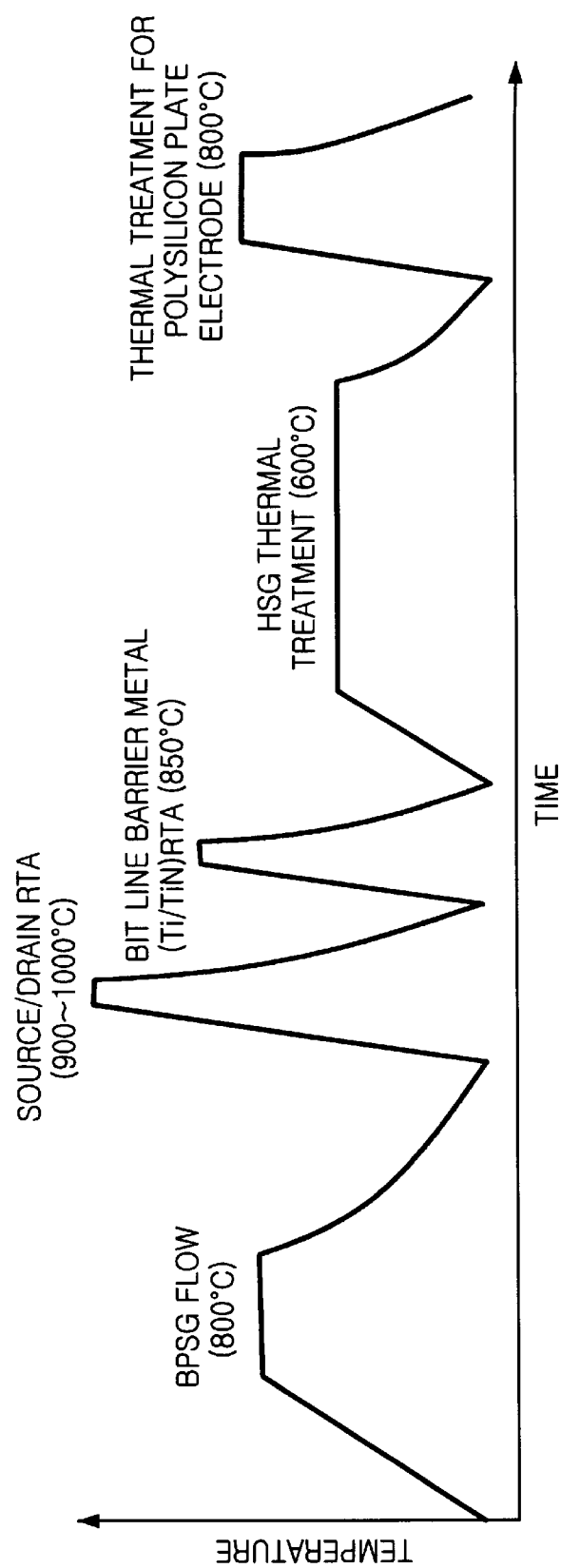
FIG. 8 shows source/drain RTA and a plurality of subsequent processes performed after forming the source/drain of transistor.

As shown in FIG. 8, in another embodiment of the present invention, source/drain RTA is performed to activate the dopants of p$^+$ source/drain regions right after thermal treatment at around 800° C. for BPSG flow. Therefore, after ion-implantation of p$^+$ source/drain regions, no source/drain RTA needs to be performed to activate dopants. In this embodiment, the source/drain RTA may be performed for 5 to 60 seconds at a temperature of 900 to 1100° C. in the ambient atmosphere of N$_2$ gas (1 to 20 slpm). The desired ramping rate and cooling rate are 20 to 250° C./sec and 20 to 100° C./sec, respectively.

In case of performing source/drain RTA as above, the dopants in the p$^+$ source/drain regions, which have become inactive during low thermal treatment, can be reactivated, thereby preventing an increase in contact resistance and junction resistance.

An example of performing source/drain RTA at the temperature of 900 to 1100° C. right after the process of BPSG flow has been described in FIG. 8. However, the dopants can be re-activated as well, not only when going through the subsequent process such as inter-layer insulating film (BPSG) flow procedure, bit line barrier metal (Ti/TiN) RTA, and hemispheric silicon grain (HSG) thermal treatment for electric storing electrodes, but also when performing high-temperature source/drain RTA right after performing all the low thermal treatments at temperatures of 600 to 850° C.

When manufacturing dynamic random access memories (DRAMS), a final thermal treatment performed at a temperature of 600 to 850° C. among the thermal treatments following the formation of p$^+$ source/drain is a thermal treatment for polysilicon plate electrodes. Currently, the thermal treatment for polysilicon plate electrodes is performed in a furnace at a temperature of around 800° C.

In yet another embodiment of the present invention, a final low thermal treatment of a corresponding manufacturing process, which is performed at a temperature of 600 to 850° C., among the subsequent thermal treatments after the formation of p$^+$ source/drain regions is replaced with high-temperature RTA performed at a temperature of 900 to 1100° C., just as the thermal treatment for polysilicon plate electrodes is performed.

So, after ion-implantation of p$^+$ source/drain regions, there is no need to perform source/drain RTA to activate the dopants. In an embodiment of the present invention, the RTA is performed at 900 to 1100° C. for 5 seconds to 10 minutes in the ambient atmospheric of N$_2$ gas (1 to 20 slpm). The desired ramping rate and cooling rate are 20 to 250° C./sec and 20 to 100° C./sec, respectively.

Meanwhile, in other devices which are not DRAMS, the thermal treatment for polysilicon plate electrodes can be dismissed. In this case, the final low thermal treatment has to be replaced with the high-temperature procedures described above.

When performing the above procedures, the effect that the subsequent thermal treatments provide can be obtained while not increasing the general thermal budget by replacing the low-temperature furnace thermal treatment with the high-temperature RTA procedures. Moreover, the activation rate can be heightened by re-activating the dopants in the p$^+$ source/drain which has become inactive during low thermal treatment of 600 to 850° C., thereby preventing an increase in contact resistance and the junction resistance of the p$^+$ source/drains.

An embodiment of the present invention described above has an effect of reducing EOR defects and the resistance of p$^+$ source/drain region by controlling the dosage of Fluorine (F) during ion-injection of p$^+$ source/drain region. Also, an embodiment of the invention can reduce the contact resistance and junction resistance by replacing subsequent thermal treatment procedures of the p$^+$ source/drain regions and thus increasing the activation rate of the dopant of the p$^+$ source/drain regions.

While the present invention has been described with respect to the embodiments, it will be apparent to those skilled in the art that various changes and modifications may be made without departing from the scope of the invention as defined in the following claims.

What is claimed is:

1. A method for fabricating a semiconductor memory device having a p-type source/drain, the method comprising the steps of:

forming a first amorphous layer in a p-type source/drain region by implanting first dopants including fluorine and boron;

implanting second dopants including boron in the first amorphous layer formed in the p-type source/drain region;

performing a plurality of subsequent processes accompanying a thermal treatment;

performing a first rapid thermal annealing process for activating the first dopants and the second dopants;

forming the p-type source/drain by performing a thermal treatment for activating the first dopants and the second dopants;

forming a contact hole that exposes the p-type source/drain region by selectively removing an insulating layer covering the P-type source/drain region;

forming a second amorphous layer in a second p-type source/drain region exposed under the contact hole by implanting third dopants including fluorine and boron;

implanting fourth dopants including boron in the second amorphous layer; and performing a thermal treatment for activating the third dopants and the fourth dopants.

2. The method as recited in claim 1, wherein the first dopants and the third dopants are selected from a group consisting $BF_2$ and BF.

3. The method as recited in claim 2, wherein the second dopants and the fourth dopants are selected from a group consisting BF and B.

4. The method as recited in claim 1, wherein the first dopants are $BF_2$ and the second dopants are B.

5. The method as recited in claim 4, wherein a dosage of the first dopants is in a range of $1\times10^{15}$#/cm$^3$ to $2\times10^{15}$#/cm$^3$ and a dosage of the second dopants is in a range of $1\times10^{15}$#/cm$^3$ to $2\times10^{15}$#/cm$^3$ wherein "#" is defined as a number of dopants.

6. The method as recited in claim 5, wherein the first dopants are implanted with an energy of 10 KeV to 30 KeV and the second dopants are implanted with an energy of 3 KeV to 4.5 KeV.

7. A method for fabricating semiconductor memory device having a p-type source/drain, the method comprising:

forming an amorphous layer in a p-type source/drain region by implanting first dopants including fluorine and boron;

implanting second dopants including boron in the amorphous layer formed in the p-type source/drain region;

performing a plurality of subsequent processes accompanying a thermal treatment at a temperature in the range of 600° C. to 850° C.; and performing a first rapid thermal annealing process (RTA) for activating the first dopants and the second dopants at a temperature in the range of 900° C. to 1100° C.

8. The method as recited in claim 7, wherein the method further comprises after implanting second dopants, performing a second RTA process for forming a p-type source/drain by activating the first dopants and the second dopants.

9. The method as recited in claim 7, wherein the first rapid thermal annealing is performed right after the thermal treatments accompanying the subsequent processes.

10. The method as recited in claim 9, further including forming an interlayer insulating layer and wherein a thermal treatment for forming the interlayer insulating layer is one of the plurality of thermal treatments accompanying the subsequent processes.

11. The method as recited in claim 7, wherein the first rapid thermal annealing process is performed in ambient $N_2$ gas atmosphere for 5 seconds to 60 seconds.

12. The method as recited in claim 11, wherein the flow rate of $N_2$ gas is 1 slpm to 20 slpm.

13. The method as recited in claim 12, wherein a ramping rate of the first rapid thermal treatment is 20° C./sec to 250° C./sec and wherein a cooling rate of the first rapid thermal treatment is 20° C./sec to 100° C./sec.

14. The method as recited in claim 7, wherein one of the plurality of subsequent processes is a formation process for a polylsilicon plate electrode, and wherein the thermal treatment is for activating dopants in the polysilicon.

* * * * *